(12) United States Patent
Spisak

(10) Patent No.: US 10,983,146 B2
(45) Date of Patent: Apr. 20, 2021

(54) OSCILLOSCOPE PERSISTENCE FOR DIGITAL BUS SIGNALS

(71) Applicant: Tektronix, Inc., Beaverton, OR (US)

(72) Inventor: Kevin C. Spisak, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 411 days.

(21) Appl. No.: 15/393,090

(22) Filed: Dec. 28, 2016

(65) Prior Publication Data

US 2018/0180647 A1    Jun. 28, 2018

(51) Int. Cl.
*G01R 13/02* (2006.01)

(52) U.S. Cl.
CPC ..... *G01R 13/0209* (2013.01); *G01R 13/0227* (2013.01); *G01R 13/0236* (2013.01)

(58) Field of Classification Search
CPC ............ G01R 13/0209; G01R 13/0227; G01R 13/0236
USPC ....................................... 324/121 R
See application file for complete search history.

(56) References Cited

U.S. PATENT DOCUMENTS

| | | | | |
|---|---|---|---|---|
| 5,765,163 A * | 6/1998 | Blackman | ............. | G06F 16/289 |
| 5,949,495 A * | 9/1999 | Tallman | ................. | H04N 17/00 345/157 |
| 6,518,744 B1 * | 2/2003 | Tallman | ................. | G01R 13/208 324/121 R |
| 2003/0095099 A1 * | 5/2003 | Azinger | ................. | G01R 13/30 345/157 |
| 2004/0186673 A1 * | 9/2004 | Agoston | ............ | G01R 13/0227 702/70 |
| 2005/0273284 A1 * | 12/2005 | Pickerd | .................. | G11C 27/00 702/66 |
| 2007/0217694 A1 * | 9/2007 | Sullivan | ............. | G01R 13/0272 382/232 |
| 2007/0268960 A1 * | 11/2007 | Jia | ........................... | G01S 19/28 375/147 |
| 2013/0308387 A1 * | 11/2013 | Tanzawa | ............ | G11C 16/0483 365/185.18 |
| 2016/0098561 A1 * | 4/2016 | Keller | .................. | G06F 21/554 726/24 |

* cited by examiner

*Primary Examiner* — Farhana A Hoque
(74) *Attorney, Agent, or Firm* — Miller Nash Graham & Dunn; Andrew J. Harrington

(57) ABSTRACT

A test and measurement system is disclosed that includes an input for receiving a digital bus conducting a plurality of digital values, a display, and a memory. The memory stores hit frequencies for the digital values, and stores data indicating the digital values. The test and measurement system also includes at least one processor coupled to the display and the memory. The processor causes the display to depict the digital values and hit frequencies of the digital values by depicting persistence of the digital values over time and by depicting decay of the digital values over time.

19 Claims, 6 Drawing Sheets

DPO Memory

| Mem. Row # | Mem. Row Label | TS 1 | TS 2 | TS 3 | TS 4 | TS 5 | TS 6 | TS 7 | TS 8 | TS 9 |
|---|---|---|---|---|---|---|---|---|---|---|
| 1 | Val 1 | 8 | 4 | 4 | 4 | 6 | 0 | 0 | 0 | 2 |
| 2 | Val 1 to 2 | 0 | 4 | 0 | 0 | 0 | 0 | 0 | 0 | 0 |
| ... | ... | ... | ... | ... | ... | ... | ... | ... | ... | ... |
| n | Val 1 to n | 0 | 0 | 0 | 0 | 0 | 6 | 0 | 0 | 0 |
| n+1 | Val 2 to 1 | 0 | 0 | 0 | 2 | 0 | 0 | 0 | 2 | 0 |
| n+2 | Val 2 | 0 | 0 | 4 | 2 | 2 | 2 | 2 | 0 | 0 |
| n+3 | Val 2 to 3 | 0 | 0 | 0 | 0 | 0 | 0 | 0 | 0 | 0 |
| ... | ... | ... | ... | ... | ... | ... | ... | ... | ... | ... |
| 2n | Val 2 to n | 0 | 0 | 0 | 0 | 0 | 0 | 0 | 0 | 0 |
| ... | ... | ... | ... | ... | ... | ... | ... | ... | ... | ... |
| $n^2$ | Val n | 0 | 0 | 0 | 0 | 0 | 0 | 6 | 6 | 6 |
| $n^2$+1 | Bus Val. 1 | 0xA | 0xA | 0xA | 0xA | 0xA | 0xA | N/A | 0xD | 0xD |
| $n^2$+2 | Bus Val. 2 | N/A | 0xB | 0xB | 0xB | 0xB | 0xB | 0xB | 0xB | N/A |
| ... | ... | ... | ... | ... | ... | ... | ... | ... | ... | ... |
| $n^2$+n | Bus Val. n | N/A | 0xC | 0xC | N/A | N/A | 0xC | 0xC | 0xC | 0xC |

FIG. 2

Display

| Display Row Label | TS 1 | TS 2 | TS 3 | TS 4 | TS 5 | TS 6 | TS 7 | TS 8 | TS 9 |
|---|---|---|---|---|---|---|---|---|---|
| Val 1 | Heavy Shading | Med. Shading | 0xA Med. Shading | Med. Shading | Med.-Heavy Shading | | | Arrow Val. 1-2 | 0xD Low Shading |
| Space | | Arrow Val. 1-2 | | Arrow Val. 1-2 | | Arrow Val. 1-n | | Arrow Val. 2-1 | |
| Val 2 | | Arrow Val. 1-2 | Med. Shading | Low Shading | 0xB Low Shading | Low Shading | Low Shading | Arrow Val. 2-1 | |
| Space | | | | | | Arrow Val. 1-n | | | |
| ⋮ | ⋮ | ⋮ | ⋮ | ⋮ | ⋮ | ⋮ | ⋮ | ⋮ | ⋮ |
| Space | | | | | | Arrow Val. 1-n | | | |
| Val n | | | | | | Arrow Val. 1-n | Med.-Heavy Shading | 0xC M-H Shading | Med.-Heavy Shading |

OSCILLOSCOPE PERSISTENCE FOR DIGITAL BUS SIGNALS

FIELD OF THE INVENTION

This disclosure is directed to a system and methods for oscilloscope operation, and, more particularly, to a system and methods for employing oscilloscope persist and decay circuitry to display digital bus signals.

BACKGROUND

Test and measurement systems are designed to receive signals, sample the signals, and display the results. Certain test and measurement systems are equipped to depict signal changes over time. For example, a test and measurement system may measure a signal over many signal cycles and overlay sampled data on the display. A heat map may be used to depict the signal portions. A heat map is a graphical representation of data where individual values are depicted by color according to the value's occurrence frequency. For example, a heat map may employ a color, such as yellow, to indicate that a signal traverses a certain portion of the display repeatedly, while employing a different color, such as red, to indicate that the signal traverses a different portion of the display less frequently. A signal may change over time. Persist features may allow the test and measurement system to maintain signal values over time, while removing data when such data becomes stale. For example, a commonly occurring signal value may initially be depicted with a high occurrence frequency color. When the signal value occurs less often, the color may be changed to indicate a drop in occurrence frequency. When the signal value ceases to occur, the test and measurement system may cease to depict the value. By employing heat maps and persist systems, a user can determine how a signal changed over time. Heat maps and persist systems, while useful for depicting changing analog signals, are not amenable for displaying discrete and/or digital signals. Further, heat maps and persist systems may not be amenable for use in conjunction digital buses, such as parallel buses, conducting multiple values simultaneously.

Aspects of the invention address these and other issues.

BRIEF DESCRIPTION OF THE DRAWINGS

FIG. 2 illustrates an exemplary digital phosphor oscilloscope (DPO) memory configured for storing digital values from a digital bus.

FIG. 3 illustrates an example test and measurement system display indicating digital values received over time as effected by persistence and decay.

DETAILED DESCRIPTION

Figure 1:
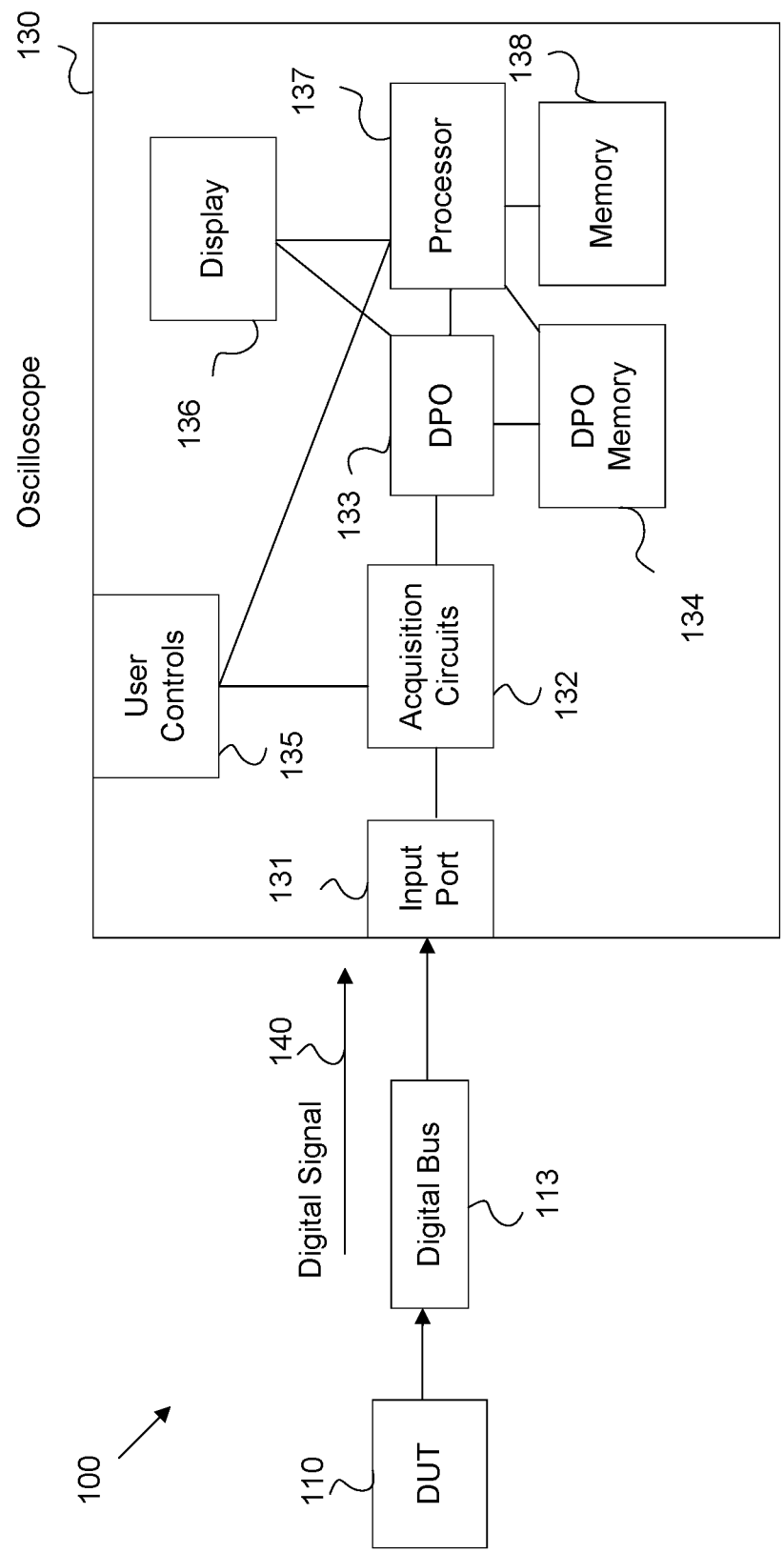
FIG. 1 is a block diagram of an example of a test and measurement system including an oscilloscope configured to employ persistence to display values received on a digital bus over time.

The aspects of the present disclosure are susceptible to various modifications and alternative forms. Specific aspects have been shown by way of example in the drawings and are described in detail herein below. However, it should be noted that the examples disclosed herein are presented for the purposes of clarity of discussion and are not intended to limit the scope of the general concepts disclosed to the specific aspects described herein unless expressly limited. As such, the present disclosure is intended to cover all modifications, equivalents, and alternatives of the described aspects in light of the attached drawings and claims.

References in the specification to aspect, example, etc., indicate that the described item may include a particular feature, structure, or characteristic. However, every disclosed aspect may or may not necessarily include that particular feature, structure, or characteristic. Moreover, such phrases are not necessarily referring to the same aspect unless specifically noted. Further, when a particular feature, structure, or characteristic is described in connection with a particular aspect, such feature, structure, or characteristic can be employed in connection with another disclosed aspect whether or not such feature is explicitly described in conjunction with such other disclosed aspect.

Disclosed herein is a test and measurement system, such as an oscilloscope operating in digital phosphor oscilloscope (DPO) mode, to employ persistence to display values received on a digital bus over time. The test and measurement system may employ DPO memory to store digital values. For example, a DPO mode test a measurement system may employ memory with each memory cell mapped to a corresponding screen location of a graticule. The DPO memory can be remapped to display digital values. For example, certain lines of DPO memory may be allocated as hit lines associated with particular digital values. The hit lines of memory may store a number of hits indicating the frequency of occurrence (e.g. hit frequency) of the corresponding digital value. Other lines of DPO memory may be allocated as value lines and may store labels indicating the values associated with the corresponding hit lines. By employing such a scheme, limited DPO memory can be employed to store the hit frequency for a plurality of arbitrary values (e.g. twenty-one separate digital values). Such values may be depicted on a test and measurement display, such as a graticule, by employing bar labels with length indicating digital value duration over time. Transitions between digital values can be depicted by arrows. The bar labels and/or arrows can change in color, size, or other graphical attributes to depict hit frequency over multiple scans, trigger events, etc. Accordingly, a user may employ the test and measurement system to display the digital values over time using principals of persistence and decay.

FIG. 1 is a block diagram of an example of a test and measurement system 100 including an oscilloscope 130 configured to employ persistence to display values received on a digital bus 113 over time. The values are received from a Device Under Test (DUT) 110 via the digital bus 113. The DUT 110 may be any signal source configured to communicate via electrical signals. For example, DUT 110 may include a transmitter (Tx) configured to transmit signals over an electrically conductive medium. In some cases, DUT 110 is a device designed to transmit signals to a corresponding receiver (not shown). The DUT 110 may be coupled to the oscilloscope 130 for testing purposes, for example when the DUT 110 is believed to be engaged in transmitting faulty signals and/or for verification of signaling accuracy for a newly designed DUT 110. The DUT 110 may be configured to transmit digital values over digital bus 113 as digital signal 140. Unlike an analog signal, which includes continuous values, the digital signal 140 is a signal that contains a plurality of discrete pulses (e.g. high and low values) that, when taken together, represent a character. For example, the digital signal 140 may contain digital values encoded as binary and/or hexadecimal numbers.

The digital bus 113 is any conductive medium configured to conduct digital signal 140 from the DUT 110 to the oscilloscope 140. Digital bus 113 may be a serial bus that conducts values as pulses separated by time. The digital bus 113 may also be a parallel bus that simultaneously conducts multiple pulses that, when taken together, represent a character. Hence, the digital bus 113 in a parallel configuration may conduct each digital value as a set of parallel signals. For example, a digital bus 113 configured to transmit a hexadecimal value may contain four conductive lines, with each line conducting a high or low value. Such a digital bus 113 could signal 0000-1111 (e.g. 0-F in hexadecimal 0-15 in base 10).

A user may wish to test the DUT 110 by reviewing the values encoded into digital signal 140 as such values change over time. An analog signal can be displayed via a heat map showing signal values changing over time by using a heat map generated by so called DPO mode. Signal portions repeatedly sampled at the same value are displayed with color indicating greater intensity, while signal values occurring less frequently are shown with reduced intensity. Displaying changes in a signal over multiple triggers/scans is referred to as persistence. Further, a process called decay is used to cause a displayed signal value to fade away if the signal value is not received again over a period of time. Such a heat map may be useful for displaying a single analog signal. Such a heat map may not be useful for displaying a signal such as digital signal 140 because the overall value of the digital signal 140 is a function of multiple signal pulses. A heat map for digital signal 140 would decompose each value into component parts and mix such components in a manner that would not output useful information.

The oscilloscope 130 is configured act as a DPO oscilloscope by providing DPO functionality for digital signal 140. In other words, oscilloscope 130 provides a mechanism for displaying digital values by employing persistence and decay. The oscilloscope 130 is any device configured to act as a test and measurement system for DUT 110. For example, oscilloscope 130 may be coupled to the DUT 110, the digital bus 113, and any combination thereof. The oscilloscope 130 may be coupled to the other components directly and/or via test probes, cables, accessories, and the like. The oscilloscope 130 may be employed to test digital signal 140 for purposes of debugging, design modification, component configuration, etc. The oscilloscope 130 may include an input port 131, which is any port configured to receive digital bus 113 and conduct digital signal 140 into the oscilloscope 130. The oscilloscope 130 also includes acquisition circuits 132, a DPO component 133, a DPO memory 134, a processor 137, a memory 138, a display 136, and user controls 135, which are discussed below. It should be noted that oscilloscope 130 may include additional components, but that only components relevant to DPO mode for digital signal 140 are discussed for purposes of clarity.

The acquisition circuits 132 are circuits configured to sample digital signal 140 to obtain values from the digital signal 140. Acquisition circuits 132 may also include additional circuitry to condition digital signal 140, for example by performing synchronization, signal de-embedding, and/or perform other pre-processing as desired. For example, the acquisition circuits 132 may include amplifiers, samplers, phase reference circuits, clock recovery circuits, and/or other components for signal sampling and/or signal conditioning. The acquisition circuits 132 may be implemented as one or more application specific integrated circuits (ASICs), digital signal processor (DSPs), or other processing circuitry.

The DPO component 133 is configured to store sampled digital values from the digital signal into DPO memory 134. The DPO component 133 may also cause such digital values to be displayed on the display 136 by employing persistence and/or decay. The DPO component 133 may be implemented as an application specific integrated circuit (ASIC), as a digital signal processor (DSP), as a module on processor 137, as software stored in memory 138 and executed by processor 137 (e.g. a computer program product stored on a non-transitory storage medium), etc. The DPO component 133 may store sampled digital values to DPO memory 134 as discussed with respect to FIG. 2 below. The DPO component 133 may also cause the display 136 to display the digital values sampled from the digital signal 140 as discussed with respect to FIGS. 3-4 below. The DPO component 133 may also implement any methods disclosed herein, such as methods 500 and/or 600.

The DPO memory 134 is a storage medium configured to store digital samples for display on display 136. The DPO memory 134 may be implemented as processor cache, random access memory (RAM), solid state memory, hard disk drive(s), or any other memory type. The DPO memory 134 includes lines of memory cells for storage of such data. Unlike a DPO memory for analog persistence systems, the DPO memory 134 cells may not contain a direct correlation between a memory cell and a corresponding display pixel. Instead, the DPO memory 134 includes a plurality of hit lines for storing hit frequencies for a plurality of digital values and a plurality of value lines for storing data indicating the digital values. A hit, as discussed herein, indicates the occurrence of a corresponding value at a corresponding temporal location during a triggered acquisition period. Particular digital values may be assigned to a corresponding hit line in order of occurrence. The hit line then stores hit occurrences for the corresponding digital value during successive acquisition periods. The relative number of hits for a digital value is referred to herein as a hit frequency, and hence hit frequency for the digital values is stored in the hit lines. Data indicating which digital value is stored in each hit line is stored in the value lines. Values may decay over time. Hence the DPO memory stores the digital values as the occur until the hit lines and/or value lines are full. When a value decays due to non-occurrence for a specified acquisition period, such value may be removed from DPO memory to make room for other values. The DPO memory 134 may also include an other line in order to accept hit frequencies of digital values when the hit lines and/or value lines are full.

The processor 137 may be implemented as a general purpose processor. Processor 137 is configured to execute instructions from memory 138. The processor 137 may also operate in conjunction with DPO component 133 and/or DPO memory 134 to perform any methods and/or associated steps indicated by the instructions. For example, in some embodiments the DPO component is implemented, in whole or in part, in the processor 137. The memory 138 may be implemented as processor cache, RAM, ROM, solid state memory, hard disk drive(s), or any other memory type. Memory 137 acts as a non-transitory medium for storing data, computer program products, and other instructions, and providing such data/products/instruction to the processor 137 for computation as desired.

The user controls 135 are coupled to the processor 132, acquisition circuits 132, and/or any other oscilloscope 130 components as desired. The user controls 135 may comprise general control knobs, gain controls, triggers, display adjustments, power controls, or any other controls employable by a user to display or alter a display of the digital signal 140 on the display 136. The display 136 may be a digital screen or a cathode ray tube based display. Display 136 may include one or more graticules for displaying corresponding input signals, such as digital signal 140 by employing persistence and decay as discussed below with respect to FIGS. 3-4.

Accordingly, the DPO component 133 and/or processor 137 may act as at least one processor that causes the display 136 to depict digital values and hit frequencies/intensities of the digital values as stored in DPO memory 134. The DPO component 133 and/or processor 137 store digital values and corresponding hit frequencies in DPO memory 134 to implement DPO persistence for the digital values. The DPO component 133 and/or processor 137 may also implement decay by decrementing hit frequencies when corresponding digital values are not received over a specified acquisition period. The DPO component 133 and/or processor 137 may also control the display 136 to depict the persistence and/or decay of the digital values and corresponding hit frequencies on the display (e.g. on a graticule).

FIG. 2 illustrates an exemplary digital phosphor oscilloscope (DPO) memory 200 configured for storing digital values from a digital bus, such as digital bus 113. DPO memory 200 may be substantially similar to DPO memory 134, and can be managed by a DPO component, such as DPO component 133 and/or a processor such as processor 137. DPO memory 200 may be configured with a plurality of hit lines 210 and a plurality of value lines 230. The hits lines 210 are each configured to store hit data indicating hit frequencies 211 of a corresponding digital value 231 as well as transition labels 221 indicating transitions occurring between digital values 231 in the corresponding bus. The value lines 230 are configured to store data indicating the digital values 231 stored in corresponding hit lines 210 as well as bus labels 223 for correlating the hit lines 210 to the value lines 230.

The DPO memory 200 is depicted with example stored data for purposes of discussion. The following discussion should be considered explanatory and not limiting to the data/steps discussed. DPO memory 200 may store values based on time slices (e.g. sampling occurrences) over an acquisition period. Memory row one indicates that, over multiple periods, the oscilloscope received some digital values 231 at time slices (TS) 1-5 and 9. For example, TS 1 indicates a hit frequency 211 of eight occurrences of the corresponding digital value 231, while TS 9 indicates a hit frequency of two occurrences of the corresponding digital value 231. Memory row one also contains a transition label 221 of value one, indicating that the digital values 231 corresponding to the hit frequencies 211 are stored in a value line 230 with a bus label 223 of value one, in this example saved in memory row $n^2+1$. Further, the transition label 221 does not indicate a transition. Hence, the digital value(s) 231 noted in memory row one did not change to another non-zero value over the acquisition periods. By correlating the value line 230 with the hit line 210, it can be seen that digital value 231 0xA (e.g. hexadecimal 10) was received over TS 1-5 and 0xD (hexadecimal 13) was received at TS 9 with the hit frequencies 211 shown in memory row one and with no transition. As another example, memory row two indicates that on TS 2, on four occasions, a digital value 231 was received. The transition label 221 for memory row two indicates the digital value 231 transitioned from bus value one to bus value two. By reviewing the bus labels 223, it can be seen that on the occasions shown in memory row two, the digital values 231 received transitioned from bus value one (e.g. memory row $n^2+1$) to bus value two (e.g. $n^2+2$). By reviewing the corresponding digital values 231 at TS 2, it can be seen that the values 231 transitioned from 0xA to 0xB (e.g. hexadecimal 11). Other hit frequencies 211 for each hit line 210 are shown, along with transition labels 221 indicating the corresponding value lines 230 to look up the digital values 231 as well as indicating any transitions between value lines 230 (and hence values 231).

As can be seen by the example discussed above, when a digital value 231 is first received, the hit frequency of the value is tracked by a corresponding hit line 210. Data indicating the value is stored in a value line 230. Further, transition labels 221 and bus labels 223 are employed to inform a correlation between the hit frequencies, transitions, and/or duration of each digital value 231 with a meaningful label indicating the digital value 231 received from the digital bus. Hence, the meaningful label can be used to indicate a specified hit line 210 is correlated to a specified digital value (e.g. a hexadecimal value 0x05, 0x0a, etc.) Further, the number of hits in the corresponding hit line 210 indicate the hit frequency 211 of the corresponding digital value 231. The locations of the number of hits in the corresponding hit line(s) 210 also indicate durations of the digital values 231 (e.g. as a temporal distance) as well the temporal locations of transitions between digital values 231. As such, the hit lines 210, in conjunction with the transition labels 221, also indicate signal transitions between digital values over time.

DPO memory 200 space may be limited, while the number of potential digital values 231 that can be received over the bus is unlimited. For example, a DPO memory 200 designed for use in analog DPO may employ a memory cell for each screen pixel in a one-to-one correlation. Remapping such an analog DPO memory for use as DPO memory 200 may provide for storage of a number of digital values 231 as described by the following equation:

$$N_{values} = \sqrt{N_{vertical} + \frac{1}{4}} - \frac{1}{2} \qquad \text{Equation 1}$$

where $N_{values}$ is the number of storable digital values (rounded down to the nearest whole number) and $N_{vertical}$ is the number of vertical samples that can be accommodated by the DPO memory. For example, an analog DPO memory configured to store 500 vertical samples could store twenty-one digital values 231 by employing the scheme discussed with respect to DPO memory 200.

Space is allocated for a digital value 231 and corresponding hit frequencies 211 upon receipt of the digital value 231 from the digital bus. When implemented to perform decay, the hit frequencies 211 are reduced (e.g. decremented) over time when a particular digital value is not received over a specified acquisition period. When all hit frequency values in a hit line 210 are reduced to zero, the corresponding digital value 231 has completely decayed and can be removed from the value lines 230. Space in the value lines 230 and hit lines 210 can then be reallocated for other digital values 231 upon receipt.

An other line may be maintained for overflow, which occurs when a new digital value is received from the digital bus while DPO memory 200 is already storing the maximum number of storable digital values as defined by equation 1.

In such cases, hit frequencies 211 for any unstorable digital values are stored in the other line without a corresponding value line 230. The hit frequencies 211 in the other line may or may not correlate to the same digital value, and can be depicted to the user as other. For example, memory row $n^2$ may be maintained as an other line.

FIG. 3 illustrates an example test and measurement system display 300 indicating digital values received over time as effected by persistence and decay. The display 400 may be implemented on an oscilloscope display, such as display 136, by employing a DPO/DPO memory, such as DPO component 133 and/or DPO memory 134 and/or 200. Display 300 is included to depict a correlation between memory and the resulting display 300. As shown, each value in the value lines (e.g. value lines 230) is allocated to a corresponding row. Display 300 employs value graphical items 301, shown as boxes with shading, to depict digital values, such as digital values 231, received over a digital bus, such as digital bus 113. Display 300 also uses transitional graphical items 303, shown as directional arrows, to indicate transitions between digital values. In the example shown, value one in time slice one had a hit frequency of eight in memory 200. Accordingly, in display 300, heavy shading is employed for value one in time slice one. Further, value one in time slice two had a hit frequency of four in memory 200. Accordingly, in display 300, medium shading is employed for value one in time slice two. As such, each digital value's hit frequency is shown. Further, the digital value itself is depicted over the shading. For example, digital value one is shown as 0xA in time slice three as the value 0xA is stored as bus value one in the first value line 230. Further, time slice nine depicts the value as 0xD because bus value one holds such a value in memory at the corresponding time slice. Further, transitions between the bus values are shown as transitional graphical items 303. For example, the transition label 221 in memory 200 row two indicates a transition from value one to value two. Hence, a transitional graphical item 303 corresponding to the transition label 221 is depicted as transitioning between value one and value two.

Figure 4:
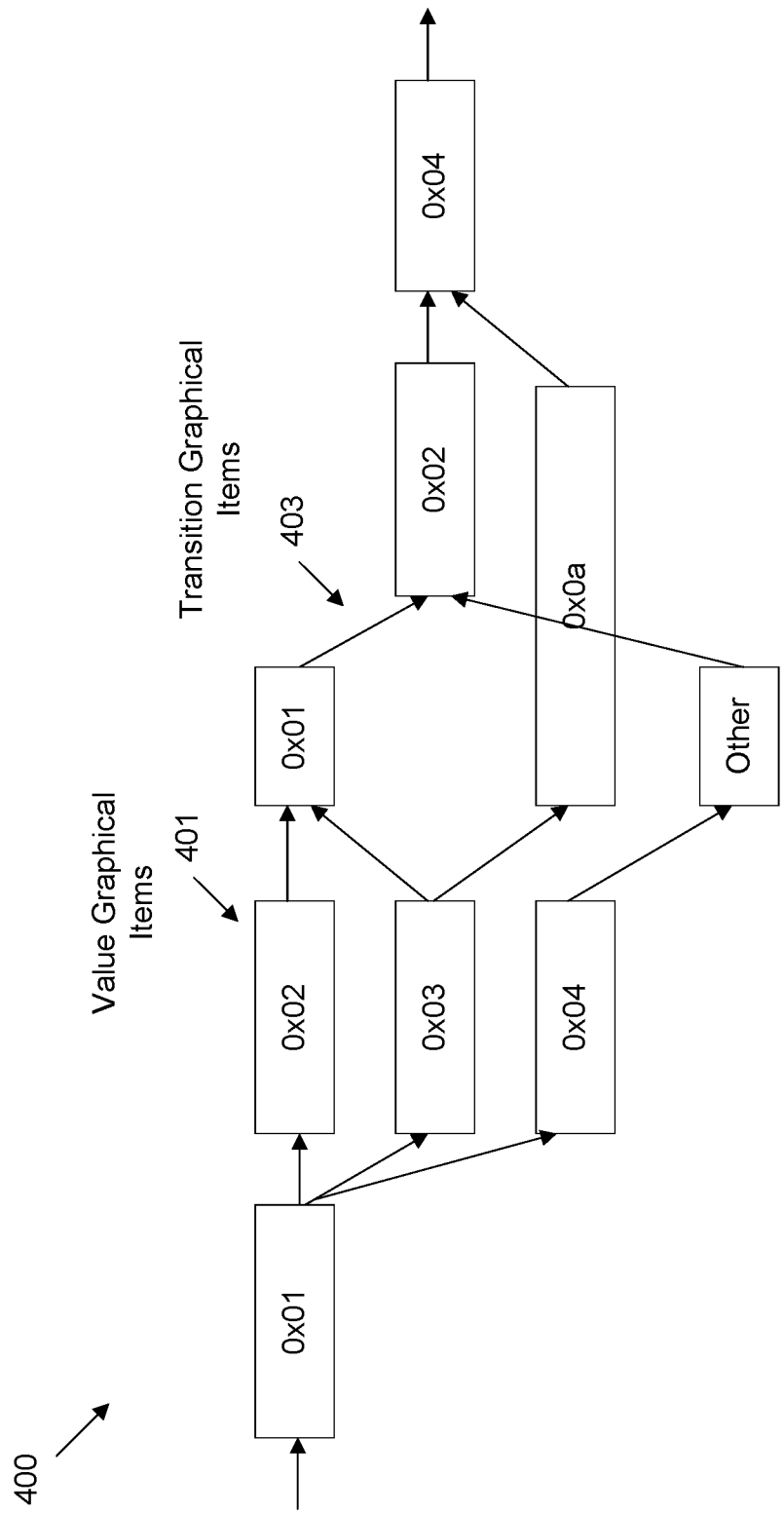
FIG. 4 illustrates another example test and measurement system display indicating digital values received over time as effected by persistence and decay.

FIG. 4 illustrates another example test and measurement system display 400 indicating digital values received over time as effected by persistence and decay. The display 400 may be implemented on an oscilloscope display, such as display 136, by employing a DPO/DPO memory, such as DPO component 133 and/or DPO memory 134 and/or 200. Display 400 may be substantially similar to display 300, but may show the graphical user interface seen by a user.

Display 400 employs value graphical items 401, shown as boxes, to depict digital values, such as digital values 231, received over a digital bus, such as digital bus 113. As shown in FIG. 4, each value graphical item 401 depicts the corresponding digital value. In the example shown in display 400, the graphical items indicate hexadecimal values 0x01, 0x02, 0x03, 0x04, and 0x0a have been received over the digital bus. The length of each graphical item indicates the duration of time during for which the corresponding digital value was received. The position of each graphical item indicates the temporal position at which the corresponding digital value was received. For example, FIG. 4 shows that 0x01 was received over the digital bus at the start of an acquisition period and again in the middle of an acquisition period. Further, the relative lengths indicate the second occurrence of 0x01 was of shorter duration than the first occurrence.

Display 400 also uses transitional graphical items 403, shown as directional arrows, to indicate transitions between digital values. For example, display 400 indicates that digital value 0x01 was received at the start of an acquisition period. The transitional graphical items 403 indicate the digital value 0x01 transitioned to 0x02 during some of the acquisition periods, transitioned to 0x03 in other acquisition periods, and transitions to 0x04 in still other acquisition periods. The digital values then transitioned from 0x02 to 0x01, from 0x03 to either 0x01 or 0x0a, and from 0x04 to other (indicating a digital value overflow), depending on the acquisition period. Further, the digital values than transitioned from other and 0x01 to 0x02, depending on the acquisition period. Finally, the digital values transitioned from 0x02 and 0x0a to 0x04, depending on the acquisition period. Accordingly, a user can review display 400 to determine digital value durations and sequences occurring over multiple acquisition periods (e.g. persistence). As such, a processor can employ DPO memory to determine digital value durations based on the stored hit frequencies. The processor can then cause the display 400 to depict digital values with value graphical items with lengths corresponding to digital value durations. Also, the processor can cause the display 400 to depict transitions between digital values with transition graphical items as desired.

Further, the value graphical items 401 and/or the transition graphical items 403 can be altered as desired to indicate the hit frequencies of the corresponding digital values. For example, the transitional graphical items 403 can be altered to indicate how often particular transitions occur. This can be accomplished by showing transition frequency as intensity by altering arrow color (e.g. employing red, yellow, green, etc. based on transition frequency), arrow thickness, arrow style, selecting alternate graphical items to indicate higher versus lower frequency transitions, etc. In addition or in the alternative, the value graphical items 401 may also be altered to indicate hit frequencies of the corresponding digital values. For example, intensity/hit frequency of digital values may be shown by altering text and/or box color (e.g. employing red, yellow, green, etc. based on hit frequency), altering text font/size, including hit frequency ratios in the boxes, selecting between various geometric shapes, etc. As such, the transition graphical items and/or value graphical items may be selected to indicate hit frequencies for the digital values over a plurality of triggered scans. It should also be noted that color can be changed as desired to indicate decay when a particular digital value is not received for several acquisition periods. In the event that a value completely decays, the digital value may be removed from the display 400.

It should be noted that, while FIGS. 2-4 depict specific digital values, hit frequencies, and graphical items, such values, frequencies, and items are selected for purposes of illustration and discussion. The mechanisms disclosed herein are robust and can be used to process, store, and display virtually any digital values and/or combinations of digital values received over a digital bus. As such, the particular digital values and associated data shown above should be considered exemplary and non-limiting.

Figure 5:
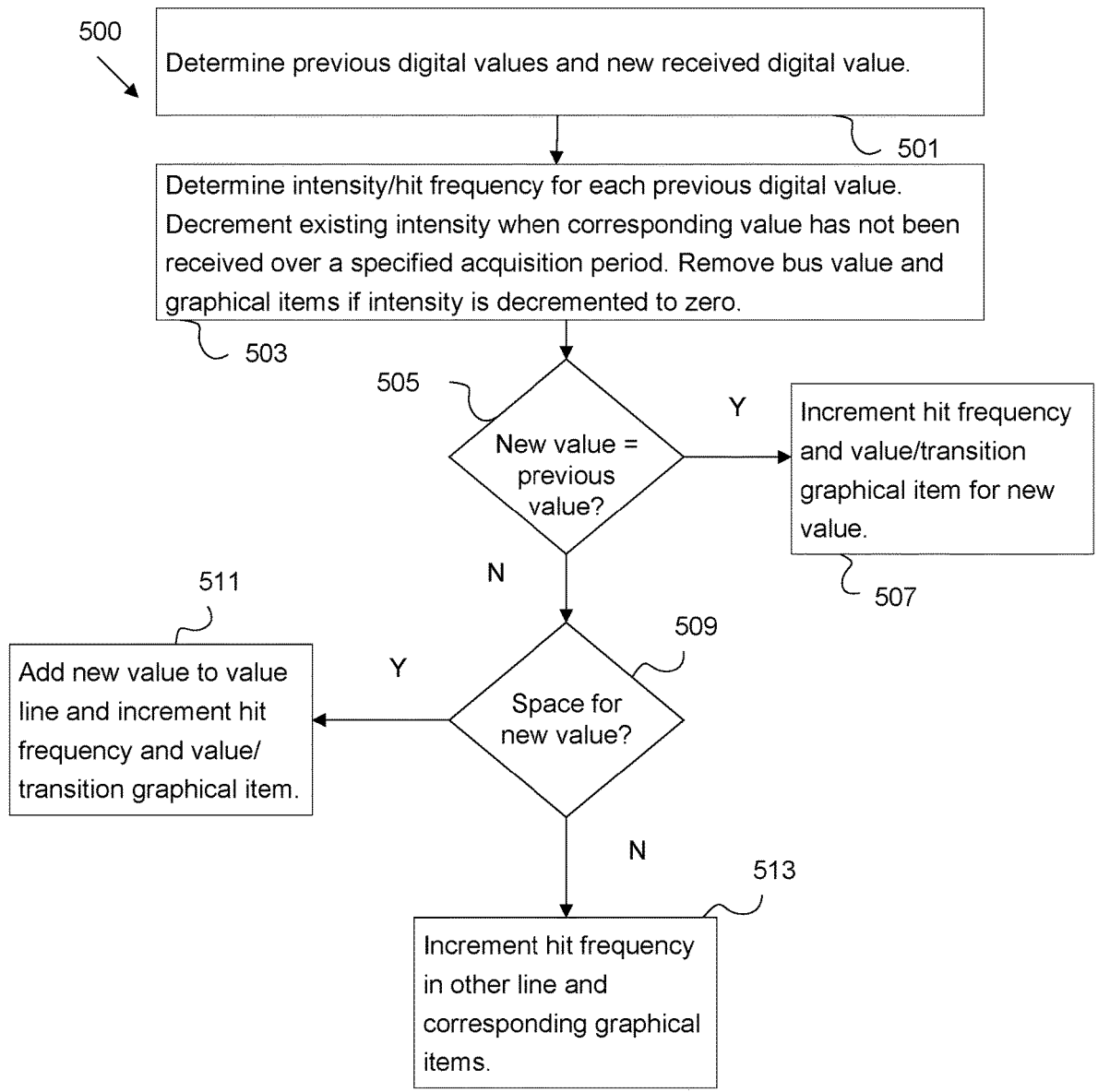
FIG. 5 is a flowchart for an example method for processing incoming digital values over time as effected by persistence and decay.

FIG. 5 is a flowchart for an example method 500 for processing incoming digital values over time as effected by persistence and decay. For example, method 500 may be implemented by a test and measurement system employing DPO memory to operate a display, such as oscilloscope 130, DPO memory 200, and display 400, respectively. As another example, method 500 may be implemented by a DPO component 133, a processor 137, a DPO memory 134, a memory 138, or combinations thereof. Method 500 may be initiated when a new digital value is received from a digital bus. At block 501, the previous digital values are determined (e.g. from DPO memory) and the new digital value is determined, for example from acquisition circuits, DPO components, etc. At block 503, the intensity and/or hit frequency is determined for each of the previous digital values. Optionally, decay can be implemented at block 503 by decrementing existing intensities/hit frequencies when a corresponding digital value has not be received over a specified acquisition period or periods. Such decrementing may occur multiple times an acquisition period, once per acquisition period, and/or once every specified number of acquisition periods. Further, the period for decrementing may be selected by a user via user controls, which would allow a user to select how quickly decay occurs. Such changes in intensity/hit frequency can be employed to alter graphical items as discussed with respect to FIGS. 3-4. Further, when intensity/hit frequency is reduced to zero for a digital value, the corresponding bus value can be removed from DPO memory and the corresponding graphical item(s) can be removed from the display.

At block 505, the method 500 determines whether the newly received value is equal to a previous value. In other words, the method 500 may determine whether the newly received digital value is already stored in a value line and/or displayed. If so, the corresponding hit frequency and value and/or transition items can all be incremented to indicate an increased intensity for the newly received digital value at block 507. If not, the method 500 may proceed to block 509 and determine whether there is space for an additional digital value in memory. If space is available, at block 511, the new value is added to a value line and the corresponding hit frequency is increased. Further, new graphical items may be displayed to indicate a new digital value and/or new transitions with a corresponding hit frequency/intensity.

If there is not space for a new value, an overflow has occurred and the method 500 proceeds to block 513. At block 513, the hit frequency of the other line is incremented to indicate an additional value has been received. The corresponding graphical items may then be updated to indicate an increased number of other digital values and associated transitions.

Figure 6:
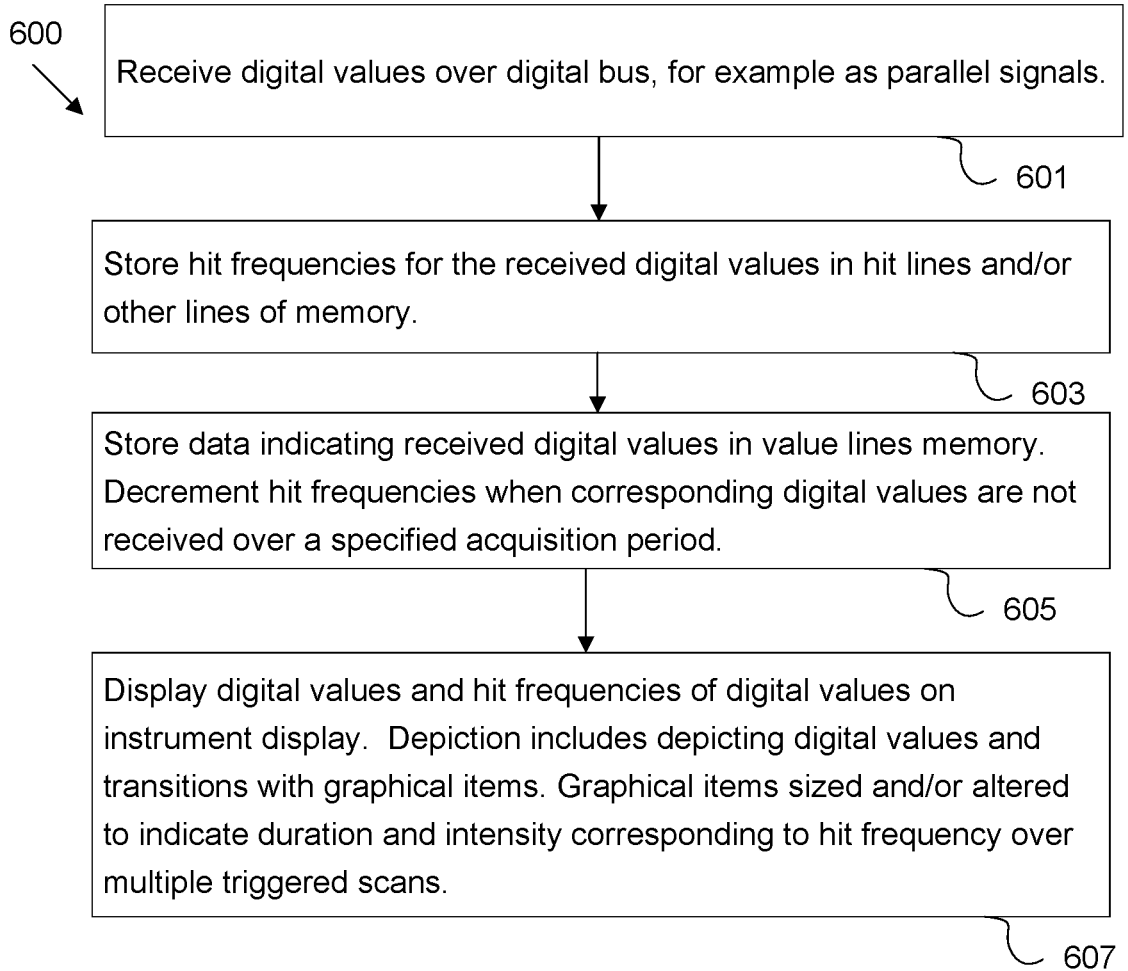
FIG. 6 is a flowchart for an example method for storing and displaying incoming digital values over time as effected by persistence and decay.

FIG. 6 is a flowchart for an example method 600 for storing and displaying incoming digital values over time as effected by persistence and decay. Method 600 may be implemented by a test and measurement system employing DPO memory to operate a display, such as oscilloscope 130, DPO memory 200, and display 400, respectively. As another example, method 500 may be implemented by a DPO component 133, a processor 137, a DPO memory 134, a memory 138, or combinations thereof. Further, method 600 may be implemented in conjunction with method 500 in some embodiments. Method 600 may be initiated when digital values are received over a digital bus at block 601. Each digital value may be received as a serial signal or as a set of parallel signals over a parallel digital bus.

At block 603, the hit frequencies for the received digital values are stored in corresponding hit lines and/or in an other line in a memory (e.g. a DPO memory). At block 605, data indicating the received digital values is also stored in memory, for example in value lines in a DPO memory. The value lines correspond to the hit lines as discussed above. Further, hit frequenc(ies) may be decremented for one or more digital values to indicate decay when such values have not been received over a specified acquisition period and/or periods. At block 607, the digital values and hit frequencies of the digital values may be displayed on a display (e.g. graticule) of a test and measurement instrument (e.g. oscilloscope). Such depiction may include depicting the digital values with value graphical items. Such depiction may also include depicting transitions with transition graphical items. The graphical items can be sized and/or graphically altered (e.g. by color change) to indicate for example digital value durations via graphical item length. Further, the graphical items can be selected to indicate hit frequencies/intensities of the digital values over a plurality of triggered acquisition periods.

It should be noted that methods 500 and/or 600 may operate continuously. While method 500 and 600 blocks are shown in an example order for clarity of discussion, methods 500/600 may be performed in any order and/or substantially simultaneously.

Aspects of the invention may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples

Illustrative examples of the technologies disclosed herein are provided below. An embodiment of the technologies may include any one or more, and any combination of, the examples described below.

Example 1 includes a test and measurement system comprising: an input for receiving a digital bus conducting a plurality of digital values; a display; a memory to: store hit frequencies for the digital values, and store data indicating the digital values; and at least one processor coupled to the display and the memory, the processor to cause the display to depict the digital values and hit frequencies of the digital values by depicting persistence of the digital values over time and by depicting decay of the digital values over time.

Example 2 includes the subject matter of Example 1, and wherein the digital bus conducts each digital value as a set of parallel signals.

Example 3 includes the subject matter of Examples 1-2, and wherein the memory includes a plurality of hit lines, each hit line to store data indicating hit frequencies of a corresponding digital value, and a plurality of value lines to store data indicating the digital values stored in corresponding hit lines.

Example 4 includes the subject matter of Examples 1-3, and wherein the memory further includes an other line to store hit frequencies of digital values when a number of received digital values is in excess of a maximum number of storable digital values.

Example 5 includes the subject matter of Examples 1-4, and wherein the hit lines further include transition labels to indicate signal transitions between digital values over time.

Example 6 includes the subject matter of Examples 1-5, and wherein the at least one processor decrements hit frequencies when corresponding digital values are not received over a specified acquisition period.

Example 7 includes the subject matter of Examples 1-6, and wherein the test and measurement system is a DPO, and wherein the memory is DPO memory.

Example 8 includes the subject matter of Examples 1-7, and wherein the digital values are hexadecimal numbers.

Example 9 includes the subject matter of Examples 1-8, and wherein the at least one processor is further to: determine digital value durations based on the stored hit frequencies; and cause the display to depict digital values with value graphical items with lengths corresponding to digital value durations.

Example 10 includes the subject matter of Examples 1-9, and wherein the at least one processor is further to cause the display to depict transitions between digital values with transition graphical items, the transition graphical items selected to indicate hit frequencies for the digital values over a plurality of triggered acquisition periods.

Example 11 includes a method implemented in a test and measurement system, the method comprising: receiving digital values over a digital bus; storing hit frequencies for the received digital values in a memory; storing data indicating the digital values received in the memory; and displaying the digital values and hit frequencies of the digital values by depicting persistence of the digital values over time and by depicting decay of the digital values over time.

Example 12 includes the subject matter of Example 11, and wherein displaying the digital values includes depicting digital values with value graphical items with lengths corresponding to digital value durations.

Example 13 includes the subject matter of Examples 11-12, and wherein displaying the digital values further includes depicting transitions between digital values with transition graphical items, the transition graphical items selected to indicate hit frequencies for the digital values over a plurality of triggered acquisition periods.

Example 14 includes the subject matter of Examples 11-13, and wherein each digital value is received as a set of parallel signals.

Example 15 includes the subject matter of Examples 11-14, and wherein the memory is a digital phosphor oscilloscope (DPO) memory, wherein storing hit frequencies for the received digital values includes storing hit frequencies for each digital value in corresponding hit lines in the DPO memory, and wherein storing data indicating the digital values includes storing the data indicating the digital values in value lines in the DPO memory, the value lines corresponding to the hit lines.

Example 16 includes a non-transitory storage medium comprising a computer program product, the computer program product including instructions that when executed by at least one processor cause the at least one processor to: receive digital values over a digital bus; store hit frequencies for the received digital values in a digital phosphor oscilloscope (DPO) memory; store data indicating the digital values received in the DPO memory; and display the digital values and hit frequencies of the digital values on an oscilloscope display by depicting persistence of the digital values over time and by depicting decay of the digital values over time.

Example 17 includes the subject matter of Example 16, and wherein displaying the digital values includes depicting digital values with value graphical items with lengths corresponding to digital value durations.

Example 18 includes the subject matter of Examples 16-17, and wherein displaying the digital values further includes depicting transitions between digital values with transition graphical items, the transition graphical items selected to indicate hit frequencies for the digital values over a plurality of triggered scans.

Example 19 includes the subject matter of Examples 16-18, and wherein the instructions further cause the processor to decrement hit frequencies when corresponding digital values are not received over a specified acquisition period.

Example 20 includes the subject matter of Examples 16-19, and wherein storing hit frequencies for the received digital values includes storing hit frequencies for each digital value in corresponding hit lines in the DPO memory, and wherein storing data indicating the digital values includes storing the data indicating the digital values in value lines in the DPO memory, the value lines corresponding to the hit lines.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the invention have been illustrated and described for purposes of illustration, it will be understood that various modifications may be made without departing from the spirit and scope of the invention. Accordingly, the invention should not be limited except as by the appended claims.

I claim:

1. A test and measurement system comprising:
   an input port structured to connect to a digital bus conducting a digital signal from a device under test;
   at least one acquisition circuit coupled to the input port and configured to sample the digital signal to obtain a plurality of digital values;
   a display;
   a memory configured to:
      store hit frequencies for each of the plurality of digital values for a plurality of time periods in hit lines and store hit frequencies for each transition between two of the plurality of digital values for the plurality of time periods in hit lines, each hit line including a label indicating either a digital value or a transition between digital values, and
      store data indicating the digital value associated with each hit frequency for each time period; and
   at least one processor coupled to the input port, the display, and the memory, the processor configured to determine a persistence of each the plurality of digital values over time, to determine a decay of each of the plurality of digital values over time, and to cause the display to depict the digital values and the hit frequencies of the digital values by depicting the persistence of the digital values over time and by depicting the decay of the digital values over time.

2. The test and measurement system of claim 1, wherein the digital bus conducts each digital value as a set of parallel signals.

3. The test and measurement system of claim 1, wherein the memory includes a plurality of hit lines, each hit line to store data indicating hit frequencies of a corresponding digital value, and a plurality of value lines to store data indicating the digital values stored in corresponding hit lines.

4. The test and measurement system of claim 3, wherein the memory further includes an other line to store hit frequencies of digital values when a number of received digital values is in excess of a maximum number of storable digital values.

5. The test and measurement system of claim 1, wherein the at least one processor decrements hit frequencies when corresponding digital values are not received over a specified acquisition period.

6. The test and measurement system of claim 1, wherein the test and measurement system is a digital phosphor oscilloscope (DPO), and wherein the memory is DPO memory.

7. The test and measurement system of claim 1, wherein the digital values are hexadecimal numbers.

8. The test and measurement system of claim 1, wherein the at least one processor is further configured to:
   determine digital value durations based on the stored hit frequencies; and
   cause the display to depict digital values with value graphical items with lengths corresponding to digital value durations.

9. The test and measurement system of claim 8, wherein the at least one processor is further configured to cause the display to depict transitions between digital values with transition graphical items, the transition graphical items selected to indicate hit frequencies for the digital values over a plurality of triggered acquisition periods.

10. A method implemented in a test and measurement system, the method comprising:
    receiving, at an input port, digital values over a digital bus coupled to a device under test;
    storing hit frequencies for each of the received digital values for a plurality of time periods in hit lines, each hit line of the received digital values including a label indicating the digital value in a memory;
    storing hit frequencies for each transition between two of the plurality of digital values for the plurality of time periods in hit lines, each hit line for the transitions including a label indicating the transition between digital values in the memory;
    storing data indicating the digital values associated with the hit frequencies received in the memory;
    determining a persistence of each the plurality of digital values over time;
    determining a decay of each of the plurality of digital values over time; and
    displaying the digital values and hit frequencies of the digital values by depicting the persistence of each of the digital values over time and by depicting decay of each of the digital values over time.

11. The method of claim 10, wherein displaying the digital values includes depicting digital values with value graphical items with lengths corresponding to digital value durations.

12. The method of claim 11, wherein displaying the digital values further includes depicting transitions between digital values with transition graphical items, the transition graphical items selected to indicate hit frequencies for the digital values over a plurality of triggered acquisition periods.

13. The method of claim 10, wherein each digital value is received as a set of parallel signals.

14. The method of claim 10, wherein the memory is a digital phosphor oscilloscope (DPO) memory, wherein storing hit frequencies for the received digital values includes storing hit frequencies for each digital value in corresponding hit lines in the DPO memory, and wherein storing data indicating the digital values includes storing the data indicating the digital values in value lines in the DPO memory, the value lines corresponding to the hit lines.

15. A non-transitory storage medium comprising a computer program product, the computer program product including instructions that when executed by at least one processor cause the at least one processor to:
    receive digital values over a digital bus coupled to a device under test;
    store hit frequencies for each of the received digital values for a plurality of time periods in hit lines, each hit line of the received digital values including a label indicating the digital value in a digital phosphor oscilloscope (DPO) memory;
    store hit frequencies for each transition between two of the plurality of digital values for the plurality of time periods in hit lines, each hit line for the transitions including a label indicating the transition between digital values in the digital phosphor oscilloscope (DPO) memory;

store data indicating the digital values associated with the hit frequencies received in the DPO memory;

determine a persistence of each the plurality of digital values over time;

determine a decay of each of the plurality of digital values over time; and display the digital values and hit frequencies of the digital values on an oscilloscope display by depicting persistence of the digital values over time and by depicting decay of the digital values over time.

16. The non-transitory storage medium of claim 15, wherein displaying the digital values includes depicting digital values with value graphical items with lengths corresponding to digital value durations.

17. The non-transitory storage medium of claim 16, wherein displaying the digital values further includes depicting transitions between digital values with transition graphical items, the transition graphical items selected to indicate hit frequencies for the digital values over a plurality of triggered scans.

18. The non-transitory storage medium of claim 15, wherein the instructions further cause the processor to decrement hit frequencies when corresponding digital values are not received over a specified acquisition period.

19. The non-transitory storage medium of claim 15, wherein storing hit frequencies for the received digital values includes storing hit frequencies for each digital value in corresponding hit lines in the DPO memory, and wherein storing data indicating the digital values includes storing the data indicating the digital values in value lines in the DPO memory, the value lines corresponding to the hit lines.

* * * * *